United States Patent
Stingu et al.

(10) Patent No.: US 11,043,854 B2
(45) Date of Patent: Jun. 22, 2021

(54) WIRELESS POWER TRANSFER SYSTEM AND METHOD

(71) Applicant: Spark Connected LLC, Dallas, TX (US)

(72) Inventors: Petru Emanuel Stingu, Dallas, TX (US); Kenneth Moore, Dallas, TX (US)

(73) Assignee: Spark Connected LLC, Dallas, TX (US)

( * ) Notice: Subject to any disclaimer, the term of this patent is extended or adjusted under 35 U.S.C. 154(b) by 0 days.

(21) Appl. No.: 16/913,369

(22) Filed: Jun. 26, 2020

(65) Prior Publication Data

US 2020/0328628 A1     Oct. 15, 2020

Related U.S. Application Data

(62) Division of application No. 16/141,703, filed on Sep. 25, 2018, now Pat. No. 10,714,985.

(60) Provisional application No. 62/570,883, filed on Oct. 11, 2017.

(51) Int. Cl.
| | |
|---|---|
| *H03F 3/217* | (2006.01) |
| *H02J 50/60* | (2016.01) |
| *H02J 50/12* | (2016.01) |

(52) U.S. Cl.
CPC .............. *H02J 50/60* (2016.02); *H02J 50/12* (2016.02); *H03F 3/217* (2013.01); *H03F 3/2176* (2013.01); *H03F 2200/171* (2013.01)

(58) Field of Classification Search
CPC . H02J 50/60; H02J 50/12; H02J 7/025; H03F 3/217; H03F 3/2176; H03F 2200/171

USPC .......................................................... 320/108
See application file for complete search history.

(56) References Cited

U.S. PATENT DOCUMENTS

| | | | |
|---|---|---|---|
| 3,376,578 A | 4/1968 | Sawyer | |
| 3,735,231 A | 5/1973 | Sawyer | |
| 4,860,183 A | 8/1989 | Maeda et al. | |
| 5,434,504 A | 7/1995 | Hollis et al. | |
| 5,498,948 A | 3/1996 | Bruni et al. | |
| 6,175,169 B1 | 1/2001 | Hollis, Jr. et al. | |

(Continued)

OTHER PUBLICATIONS

Digi-Key Electronics. "Inductive Versus Resonant Wireless Charging: A Truce May Be a Designer's Best Choice", Aug. 2, 2016, 8 pages.

(Continued)

*Primary Examiner* — Suresh Memula
(74) *Attorney, Agent, or Firm* — Slater Matsil, LLP

(57) ABSTRACT

In accordance with an embodiment, a wireless power transmitter includes a charging surface, a transmitting antenna configured to generate an electromagnetic field extending above the charging surface, a sensing array disposed between the transmitting antenna and the charging surface, and a controller coupled to the sensing array. The sensing array includes a plurality of sensors. Each sensor of the plurality of sensors is configured to generate a respective signal indicative of a strength of the electromagnetic field. The controller is configured to detect a presence of a metallic object, other than a receiving antenna of a power receiver, in the electromagnetic field based on the respective signal generated by one or more sensors of the plurality of sensors.

18 Claims, 8 Drawing Sheets

(56) References Cited

U.S. PATENT DOCUMENTS

| | | | |
|---|---|---|---|
| 6,184,651 B1 | 2/2001 | Fernandez et al. | |
| 6,445,093 B1 | 9/2002 | Binnard | |
| 6,803,744 B1 | 10/2004 | Sabo | |
| 6,949,845 B2 | 9/2005 | Oisugi et al. | |
| 8,049,370 B2 | 11/2011 | Azancot et al. | |
| 8,193,769 B2 | 6/2012 | Azancot et al. | |
| 8,957,549 B2 | 2/2015 | Kesler et al. | |
| 9,590,444 B2 | 3/2017 | Walley et al. | |
| 9,800,191 B2 | 10/2017 | Barsilai et al. | |
| 9,853,441 B2 | 12/2017 | Teggatz et al. | |
| 10,054,622 B2 | 8/2018 | Hernandez et al. | |
| 10,079,090 B2 | 9/2018 | Teggatz et al. | |
| 10,168,443 B2 | 1/2019 | Mangano et al. | |
| 2006/0061323 A1 | 3/2006 | Cheng et al. | |
| 2010/0181841 A1 | 7/2010 | Azancot et al. | |
| 2010/0219183 A1 | 9/2010 | Azancot et al. | |
| 2010/0244579 A1 | 9/2010 | Sogabe et al. | |
| 2011/0050164 A1 | 3/2011 | Partovi et al. | |
| 2011/0062793 A1 | 3/2011 | Azancot et al. | |
| 2011/0074344 A1 | 3/2011 | Park et al. | |
| 2011/0121660 A1 | 5/2011 | Azancot et al. | |
| 2011/0227527 A1 | 9/2011 | Zhu et al. | |
| 2012/0032632 A1 | 2/2012 | Soar | |
| 2012/0235636 A1* | 9/2012 | Partovi | H02J 5/005 |
| | | | 320/108 |
| 2013/0049484 A1 | 2/2013 | Weissentern et al. | |
| 2013/0082651 A1 | 4/2013 | Park et al. | |
| 2013/0257168 A1* | 10/2013 | Singh | H02J 50/12 |
| | | | 307/104 |
| 2013/0257172 A1 | 10/2013 | Teggatz et al. | |
| 2013/0260676 A1* | 10/2013 | Singh | H04B 5/0068 |
| | | | 455/41.1 |
| 2013/0264973 A1 | 10/2013 | Garg et al. | |
| 2013/0285601 A1 | 10/2013 | Sookprasong et al. | |
| 2013/0300204 A1 | 11/2013 | Partovi | |
| 2014/0015329 A1* | 1/2014 | Widmer | B60L 50/51 |
| | | | 307/104 |
| 2014/0080409 A1 | 3/2014 | Frankland et al. | |
| 2014/0103869 A1* | 4/2014 | Radovic | H02J 5/005 |
| | | | 320/108 |
| 2014/0159501 A1* | 6/2014 | Kanno | B60L 50/20 |
| | | | 307/104 |
| 2014/0184150 A1 | 7/2014 | Walley | |
| 2015/0054454 A1* | 2/2015 | White, II | H04B 5/0075 |
| | | | 320/108 |
| 2015/0115877 A1 | 4/2015 | Arai et al. | |
| 2015/0142348 A1 | 5/2015 | Huang et al. | |
| 2015/0233987 A1* | 8/2015 | Von Novak, III | H02J 7/025 |
| | | | 324/701 |
| 2015/0249484 A1 | 9/2015 | Mach et al. | |
| 2015/0333797 A1* | 11/2015 | Nejatali | H02J 50/20 |
| | | | 375/376 |
| 2015/0341087 A1 | 11/2015 | Moore et al. | |
| 2015/0364944 A1* | 12/2015 | Garcia Briz | H02J 50/90 |
| | | | 307/104 |
| 2016/0094048 A1* | 3/2016 | Bae | H02J 50/12 |
| | | | 307/104 |
| 2016/0118806 A1* | 4/2016 | Standke | H02J 50/40 |
| | | | 307/104 |
| 2016/0149440 A1 | 5/2016 | Staring et al. | |
| 2016/0172891 A1* | 6/2016 | Filippenko | H02J 50/12 |
| | | | 320/108 |
| 2016/0190852 A1* | 6/2016 | Chiang | G01V 3/088 |
| | | | 320/108 |
| 2016/0336804 A1* | 11/2016 | Son | H02J 50/12 |
| 2016/0336809 A1* | 11/2016 | Gluzman | H02J 7/027 |
| 2017/0005481 A1* | 1/2017 | Von Novak, III | H02J 5/005 |
| 2017/0033591 A1* | 2/2017 | Govindaraj | H02J 7/042 |
| 2017/0040843 A1* | 2/2017 | Asanuma | H02J 50/60 |
| 2017/0163100 A1 | 6/2017 | Vocke et al. | |
| 2017/0294798 A1* | 10/2017 | Yuk | H02J 7/00034 |
| 2017/0310166 A1* | 10/2017 | Huang | H01F 1/00 |
| 2018/0115197 A1* | 4/2018 | Li | H02J 50/80 |
| 2018/0219428 A1* | 8/2018 | Bae | H02J 50/90 |
| 2018/0262065 A1* | 9/2018 | Weidner | H02J 50/90 |
| 2018/0342907 A1* | 11/2018 | Dimke | B60L 53/122 |
| 2019/0068001 A1* | 2/2019 | Lovas | H02J 50/80 |
| 2019/0097448 A1* | 3/2019 | Partovi | H01F 38/14 |
| 2019/0109498 A1 | 4/2019 | Stingu et al. | |
| 2019/0190320 A1 | 6/2019 | Park | |
| 2019/0319494 A1 | 10/2019 | Park et al. | |
| 2019/0334388 A1 | 10/2019 | Van Wageningen et al. | |
| 2019/0363584 A1* | 11/2019 | Leem | H02J 7/025 |

OTHER PUBLICATIONS

Wikipedia, "Electromagnetic coil", https://en.wikipedia.org/w/index.php?title=Electromagnetic_coil&oldid=776415501, Apr. 2017, 6 pages.

Wikipedia, "Inductive charging", https://en.wikipedia.org/w/index.php?title=Inductive_charging&oldid=802615270, Sep. 2017, 7 pages.

Wikipedia, "Qi (standard)", https://en.wikipedia.org/w/index.php?title=Qi_(standard)&oldid=803427516, Oct. 2017, 5 pages.

ZENS, "ZENS First Worldwide to Introduce Built-in Wireless (Sub-)Surface Charger with Apple and Samsung Fast Charge", Jan. 24, 2019, 5 pages.

Consumer Reports, "Wireless charging pad review We tested four popular pads to see whether they really make your life easier", Wireless Charging Pad Reviews, Dec. 11, 2013, 5 pages.

Gao, Xiang, "Demodulating Communication Signals of Qi-Compliant Low-Power Wireless Charger Using MC56F8006 DSC", NXP Freescale Semiconductor Application Note, Document No. AN4701, Rev. 0, Mar. 2013, 21 pages.

Jansen, J. W., et al., "Overview of analytical models for the design of linear and planar motors", TU/e Eindhoven University of Technology, DOI: 10.1109/TMAG/2014.2328556, Jan. 1, 2014, 8 pages.

Johns, Bill et al., "Adapting Qi-compliant wireless-power solutions to low-power wearable products", Texas Instruments, High-Performance Analog Products, 2Q, 2014, Analog Applications Journal, 7 pages.

Kot, Thomas, "LC Sensor Rotation Detection with MSP430 Extended Scan Interface (ESI)", Texas Instruments, Application Report, SLAA639, Jul. 2014, 33 pages.

Lynch, Brian T., "Under the Hood of a DC/DC Boost Converter", Texas Instruments, Texas Instruments, Power Supply Design Seminar, Paper SEM1800, Dallas, TX, USA, 2008-2009, 26 pages.

Rice, John, "Examining Wireless Power Transfer", Texas Instruments, 2014/2015 Power Supply Design Seminar, 38 pages.

Texas Instruments "Industry-Leading Wireless Power Solutions—the Most Widely Adopted in the Market", ti.com/wirelesspower, SLYT485C, 3 pages.

Texas Instruments, "Introduction to Wireless Power", QI WPC 1.1 compliant, www.ti.com/wirelesspower, 49 pages.

Waters, Benjamin et al., "Optimal Coil Size Ratios for Wireless Power Transfer Applications", IEEE International Symposium on Circuits and Systems (ISCAS), Jun. 1-5, 2014, 4 pages.

* cited by examiner

WIRELESS POWER TRANSFER SYSTEM AND METHOD

CROSS-REFERENCE TO RELATED APPLICATIONS

This application is a divisional of U.S. patent application Ser. No. 16/141,703, filed Sep. 25, 2018, which claims the benefit of U.S. Provisional Application No. 62/570,883, filed on Oct. 11, 2017, which applications are hereby incorporated herein by reference.

TECHNICAL FIELD

The present invention relates generally to an electronic system and method, and, in particular embodiments, to a wireless charging system.

BACKGROUND

Wireless charging systems are becoming ubiquitous in today's society. For example, many smartphones and wearables implement wireless charging technology. Ease of use, greater reliability, spatial freedom, reduced connectors and openings, and the possibility of hermetically sealing are among the benefits offered by wireless charging. Standards, such as Qi standard from the Wireless Power Consortium are becoming popular.

High power devices such as power tools, rugged notebook computers, medical instruments, factory automation systems, drones, and even robotic vacuums can benefit from the type of wireless charging seen on devices such as wearables and smartphones. However, batteries in high power devices have much greater capacities and require higher charging rates in order to charge the device in a reasonable time. The charging rate required by high power devices starts at 30 W, but may reach up to 100 W or more.

There are many challenges in managing and providing high power levels through a wireless interface, such as efficiency, metallic Foreign Object Detection (FOD) and Electromagnetic Interference (EMI). Many of these challenges are critical to a working and safe system. Physics imposes limits on what can be accomplished using common circuit topologies and transmitter/receiver architectures, but the key is to pick an implementation that provides sufficient efficiency and safe operation at a reasonable overall cost.

SUMMARY

In accordance with an embodiment, a wireless power transmitter includes a charging surface, a transmitting antenna configured to generate an electromagnetic field extending above the charging surface, a sensing array disposed between the transmitting antenna and the charging surface, and a controller coupled to the sensing array. The sensing array includes a plurality of sensors. Each sensor of the plurality of sensors is configured to generate a respective signal indicative of a strength of the electromagnetic field. The controller is configured to detect a presence of a metallic object, other than a receiving antenna of a power receiver, in the electromagnetic field based on the respective signal generated by one or more sensors of the plurality of sensors.

In accordance with an embodiment, a wireless power receiver includes a receiver surface, a receiving antenna configured to receive an electromagnetic field extending through the receiver surface, a sensing array disposed between the receiving antenna and the receiver surface, and a controller coupled to the sensing array. The sensing array includes a plurality of sensors. Each sensor of the plurality of sensors is configured to generate a respective signal indicative of a strength of the electromagnetic field. The controller is controller configured to generate a two-dimensional (2D) map of the strength of the electromagnetic field based on the respective signal generated by one or more sensors of the plurality of sensors, and transmit the 2D map to a wireless power transmitter.

In accordance with an embodiment, a wireless power transmitter includes a transmitting antenna, a resonant capacitor coupled in series with the transmitting antenna, an amplifier coupled to the transmitting antenna, a foreign object detection circuit, and a controller. The foreign object detection circuit includes a first voltage measurement circuit coupled across terminals of the transmitting antenna, where the first voltage measurement circuit is configured to measure a first voltage, and a second voltage measurement circuit coupled across terminals of the resonant capacitor, where the second voltage measurement circuit is configured to measure a second voltage. The controller is configured to receive from a wireless power receiver an average receive power by the wireless power receiver, determine an average transmit power by the transmitting antenna based on the first voltage and the second voltage, and determine whether a metallic object is present in an electromagnetic field generated by the transmitting antenna based on the average transmit power and the average receive power.

In accordance with an embodiment, a wireless power transmitter includes a transmitting antenna, a resonant capacitor coupled in series with the transmitting antenna, a class-E amplifier, and a controller. The class-E amplifier includes a switching transistor coupled between an intermediate node and a reference terminal, where the intermediate node is coupled to the transmitting antenna, an inductor coupled between a supply terminal and the intermediate node, and a capacitor tuning bank coupled to the intermediate node. The controller is coupled to the switching transistor and is configured to turn on and off the switching transistor at a switching frequency between 80 kHz and 400 kHz, when the switching frequency is higher than a target frequency, increase a capacitance connected to the intermediate node by controlling the capacitor tuning bank, and when the switching frequency is lower than the target frequency, decrease the capacitance connected to the intermediate node by controlling the capacitor tuning bank.

In accordance with an embodiment, a wireless power transmitter includes a transmitting antenna, a resonant capacitor coupled in series with the transmitting antenna, a class-E amplifier, and a controller. The class-E amplifier includes a first switching transistor coupled between a first intermediate node and a reference terminal, where the first intermediate node is coupled to the transmitting antenna, a second switching transistor coupled between a second intermediate node and the reference terminal, where the second intermediate node coupled to the transmitting antenna, a first inductor coupled between a supply terminal and the first intermediate node, a second inductor coupled between the supply terminal and the second intermediate node, a transformer having a primary winding coupled between the first intermediate node and the second intermediate node and a secondary winding coupled to the transmitting antenna, and a capacitor tuning bank coupled to the first and second intermediate nodes. The controller is coupled to the first and second switching transistors and is configured to turn on and off the first and second switching transistors at a switching frequency.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
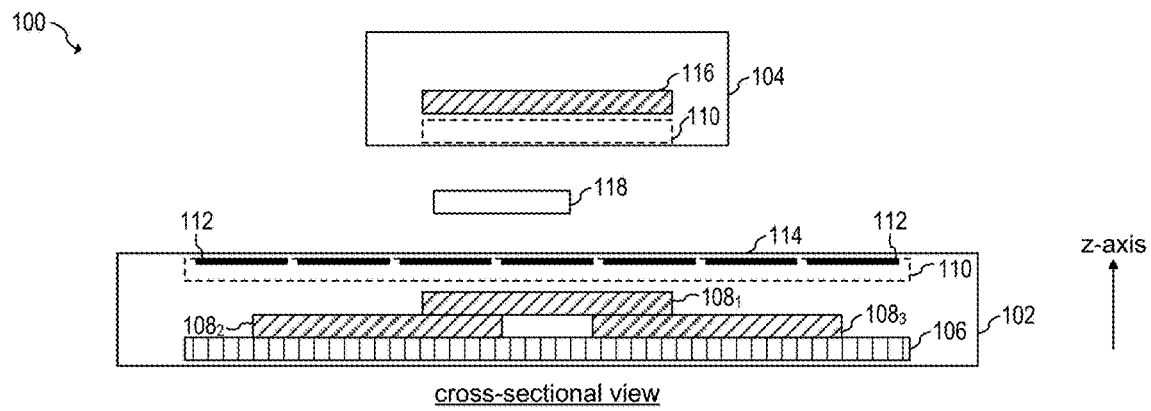
FIG. 1 shows a cross-sectional view of a wireless power system, according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to embodiments in a specific context, an inductive wireless charging system. Embodiments of the present invention may be used in other types of systems, such as resonant wireless charging systems, for example.

In an embodiment of the present invention, a sensing array that includes a plurality of sensing coils disposed between a transmitting antenna of a wireless power transmitter and a wireless charging surface of the wireless power transmitter is used to detect the presence and location of foreign metallic objects during wireless charging. A controller detects disruptions in the magnetic field by measuring the voltage across each of the coils of the sensing array to generate a two-dimensional (2D) magnetic field map. If a metallic object is detected near the wireless charging surface, the controller may stop charging, reduce the power transmitted via wireless charging, alert a user, or take any other action based on the detection of the presence and location of the metallic object. In some embodiments the sensing array is implemented in a power receiver, between an external surface of the power receiver and a receiving antenna.

In an embodiment, foreign metallic object detection is improved by using a class-E amplifier and by computing the average transmitted power by measuring the instantaneous power of the transmitting antenna. The instantaneous voltage (AC voltage) across the transmitting antenna is measured by a voltage measurement circuit. The instantaneous current (AC current) flowing through the transmitting antenna is measured by measuring the voltage across the resonant capacitor that is coupled in series with the transmitting antenna using a voltage measurement circuit.

In an embodiment, a wireless power transmitter exhibits improved EMI performance by using a class-E amplifier to drive the transmitting antenna. Some embodiments use zero-voltage switching (ZVS) or quasi ZVS (QZVS) techniques by using a zero-crossing detector. Some embodiments use a capacitor tuning bank to adjust the resonance frequency of the class-E amplifier to a desired value (such as for driving the transmitting antenna at a fixed frequency). Some embodiments further improve the EMI performance by using a transformer between the switching transistors of the class-E amplifier and the transmitting antenna. In some embodiments, the class-E amplifier is operated at low frequencies, such as frequencies between 80 kHz and 400 kHz.

FIG. 1 shows a cross-sectional view of wireless power system 100, according to an embodiment of the present invention. Wireless power system 100 includes power transmitter 102 and power receiver 104. Power transmitter 102 includes one or more transmitting antenna(s) 108 (three in this particular embodiment), shield 106, charging surface 114, and sensing array 110. Sensing array 10 includes a plurality of sensors 112. Power receiver 104 includes one or more receiving antenna 116.

During normal operation, power transmitter 102 generates a magnetic field (not shown) by circulating a low frequency AC current through transmitting antennas 108. The magnetic field induces a corresponding current in receiving antenna 116, which in turn provides power to circuits (not shown) coupled to receiving antenna 116.

Wireless power system 100 may be implemented in consumer applications, such as for charging a smartphone, or tablet, wirelessly powering an external circuit, etc. Wireless power system 100 may also be used in automotive applications, such as for charging devices inside a car, as well as in industrial applications, such as for wirelessly providing power to equipment and other devices.

Charging surface 114, which may also be referred to as an active power transfer surface, is a surface in which an external circuit or system is placed for wirelessly receiving power. Charging surface 114 should not be construed as being used only for wirelessly charging a battery of the external circuit. For example, charging surface 114 may be used for wirelessly powering an external circuit without charging a battery of such external circuit. In some embodiments, charging surface 114 is used for wirelessly charging an external circuit in addition to wirelessly powering the external circuit.

A metallic object, such as metallic object 118, may be exposed to the magnetic field generated by power transmitter 102. Such metallic objects may be referred to as foreign metallic objects. The foreign metallic objects may be classified as friendly (contained within power receiver 104) or unfriendly (separate from power receiver 104).

Regardless of their classification, foreign metallic objects, such as ferrous-based metals and alloys, may heat up in the presence of the electromagnetic field generated by power transmitter 102, for example, due to eddy currents. For example, metallic objects with lighter thermal mass may heat up more than 100° C. when in the presence of a strong magnetic field at low frequencies (e.g., between 80 kHz and 400 kHz). Heating up foreign metallic objects is generally undesirable because of reduced efficiency of energy transfer, risk of damage to the power transmitter 102 and power receiver 104, safety concerns, etc. It is therefore advantageous to detect the presence of foreign metallic objects in the electromagnetic field, which allows wireless power system 100 to take an action, such as stopping the energy transfer or reducing the power transferred, in response of detecting the presence of foreign metallic objects.

Power transmitter 102 uses sensing array 110 for foreign object detection. Sensing array 110 is disposed between transmitting antenna(s) 108 and charging surface 114, and is thereby exposed to the magnetic field generated by antenna(s) 108. Sensing array 110 includes a plurality of sensors 112, such as coils, that are capable of detecting the strength of the magnetic field. The presence of a foreign metallic object (friendly or unfriendly) in the magnetic field causes disturbances in the magnetic fields. Sensors 112 are capable of detecting such disturbances.

Sensing array 110 monitors the magnetic field and reports changes to a controller of power transmitter 102 (not shown), which then determines on the appropriate action to take, if any.

In some embodiments, sensing array 110 is implemented in power receiver 104 instead of in power transmitter 102. Power receiver 104 may capture the strength and direction of the magnetic field in a 2D magnetic field map and transmit the 2D magnetic field map to power transmitter 102 using, for example, an existing communication interface. Power receiver 104 may also send a reference 2D magnetic field map stored in a memory of power receiver 104 that was captured (e.g., during a characterization or production time) using a reference power transmitter without metallic objects. Power transmitter may compare the measured 2D magnetic field map with the reference 2D magnetic field map. Any differences between the measured and reference 2D magnetic field map is indicative of the presence of metallic objects in the electromagnetic field generated by power transmitter 102.

In some embodiments, sensing array 110 is implemented in both power transmitter 102 and power receiver 104.

Power transmitter 102 as shown in FIG. 1 includes three antennas 108. Some embodiments may have a single transmitting antenna. Other embodiments may have two transmitting antennas, or more than three transmitting antennas.

Power transmitter 102 may be implemented in various ways. For example, some embodiments implement power transmitter with power transmitter circuit 80, 900, 1000, 1300 (described below with respect to FIGS. 8-13) or a combination thereof. Other implementations are also possible.

Transmitting antenna 108 may be implemented in any way known in the art. For example, in some embodiments, transmitting antenna 108 is implemented with single-stranded wires. In other embodiments, antenna 108 is implemented with multi-stranded wires. Other implementations are also possible. For example, some embodiments implement antenna 108 in a printed circuit board (PCB), a flexible printed circuit (FPC), or using other electrically conductive materials.

Shield 106 is configured to shield sensors 112 (e.g., the back of the coils) from a magnetic field. In some embodiments, shield 106 is also configured to increase the inductance of the coils of sensors 112, as well as the coupling coefficient to receiving antenna 116. Shield 106 may be implemented, for example, using a ferrite material. Other magnetically active materials may be used.

As shown in FIG. 1, shield 106 is implemented as a single shield. In some embodiments, shield 106 may be implemented as a plurality of shields. For example, in some embodiments, each transmitting antenna 108 is disposed on top of a respective shield 106.

Metallic objects 118 may include, for example, friendly foreign metallic objects, such as the case of a smartphone or table, and unfriendly foreign metallic objects, such as coins, fasteners, paper clips, aluminum foil, metallic keys or tools, metallic objects embedded in or attached to phone protective cases, etc.

Figure 2:
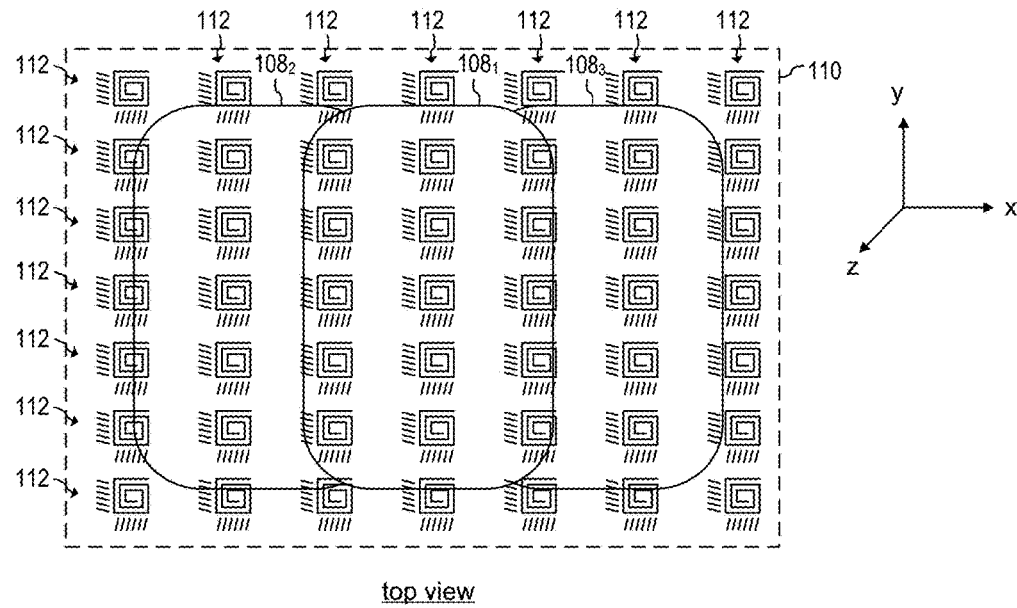
FIG. 2 shows a top view of the power transmitter of the wireless power system of FIG. 1, according to an embodiment of the present invention.

FIG. 2 shows a top view of power transmitter 102, according to an embodiment of the present invention. Although in some embodiments antenna(s) 108 may not be visible from in a top view (since antennas 108 are beneath sensing array 110), antenna(s) 108 are shown in FIG. 2 for reference purposes. Charging surface 114 is not shown in FIG. 2 for clarity purposes.

As shown in FIG. 2, sensing array 110 includes a plurality of sensors 112 arranged in rows and columns. In this embodiment, seven rows and seven columns equally spaced are shown. In some embodiments, a different numbers of rows and columns (e.g., six rows and five columns) may be used. In some embodiments, the spacing between each of the plurality of sensors 112 may be different.

Each sensor 112 includes one or more coils. Each of the coils generates a voltage that is related (e.g., proportional) to the strength of the magnetic field flowing through the core area (magnetic axis) of the coil. By measuring the voltage across terminals of each of the coils, it is possible to generate a map of the magnetic field.

Each of sensors 112, as shown in FIG. 2, includes three coils; one for each axis of a three-dimensional (3D) space (i.e., x-axis, y-axis, and z-axis). By using three coils per sensor 112, it is possible to detect the strength and orientation in the 3D space of the magnetic fields. Some embodiments may be implemented with one or more of sensors 112 implementing a single coil (e.g., for the z-axis), or two coils. In some embodiments, a Hall sensor may be used instead of or in addition to the coils of sensor 112 to detect the strength of the magnetic field. Other magnetically sensitive element may also be used.

Figure 3:
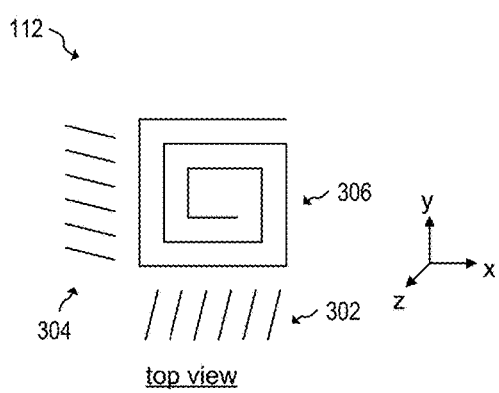
FIGS. 3 and 4 show a top view and a cross-sectional view, respectively, of a sensor of the array of metallic object sensing structures of FIG. 2, according to an embodiment of the present invention.
Figure 4:
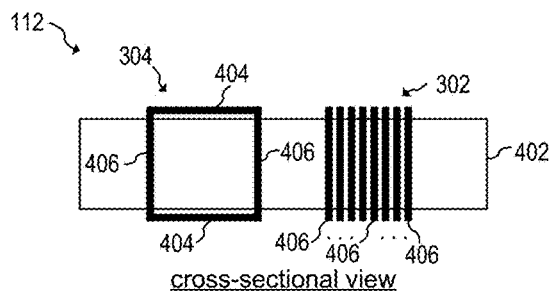

Sensing array 110 may be implemented, for example, in a PCB. For example, in a PCB, the coils of each of sensors 112 may be implemented using traces or a combination of traces and vias. FIGS. 3 and 4 show a top view and a cross-sectional view, respectively, of sensor 112, according to an embodiment of the present invention.

As shown in FIG. 3, coil 302 is capable of detecting the strength of the magnetic field in the x-axis, coil 304 is capable of detecting the strength of the magnetic field in the y-axis, and coil 306 is capable of detecting the strength of the magnetic field in the z-axis. As shown in FIG. 4, coil 304 is implemented with a combination of traces 404 and vias 406 going through PCB 402. Coil 302 is implemented with traces 404 (not shown) and vias 406. Coil 306 (not shown) is implemented with traces 404. In some embodiments, coil 306 may be implemented using partial vias, thereby having turns in inner layers of PCB 402.

Figure 5:
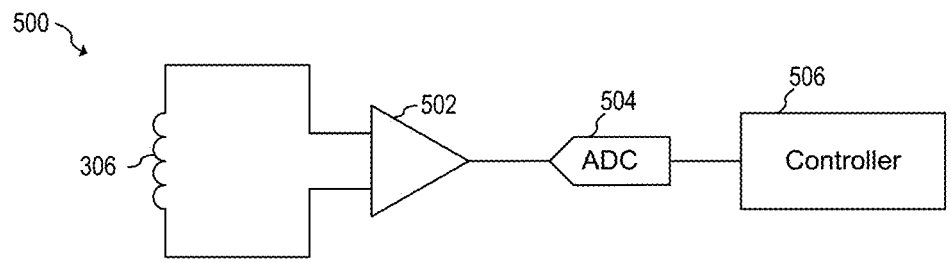
FIG. 5 shows a schematic diagram of a foreign object detection system, according to an embodiment of the present invention.

FIG. 5 shows a schematic diagram of foreign object detection system 500, according to an embodiment of the present invention. Foreign object detection system 500 includes differential amplifier 502, analog-to-digital converter (ADC) 504, and controller 506.

During normal operation, a voltage is generated across terminals of coil 306 based on the strength of the magnetic field flowing through the core area of coil 306. Such voltage is amplified by amplifier 502 and then converted into digital data by ADC 504. Controller 506 receives the digital data from ADC 504 and determines if changes in the magnetic field have occurred. Controller 506 may take an action, such as turning off power transmitter 102, reducing the amount of energy transmitted by power transmitter 102, send data based on the digital data received to power receiver 104, or take any other action (including no action).

Even though foreign object detection system 500 is illustrated detecting the strength of the magnetic field flowing through a single coil 306, it is understood that foreign object detection system 500 may also detect the strength of the magnetic field flowing through a plurality of coils 302, 304, and 306.

Figure 6:
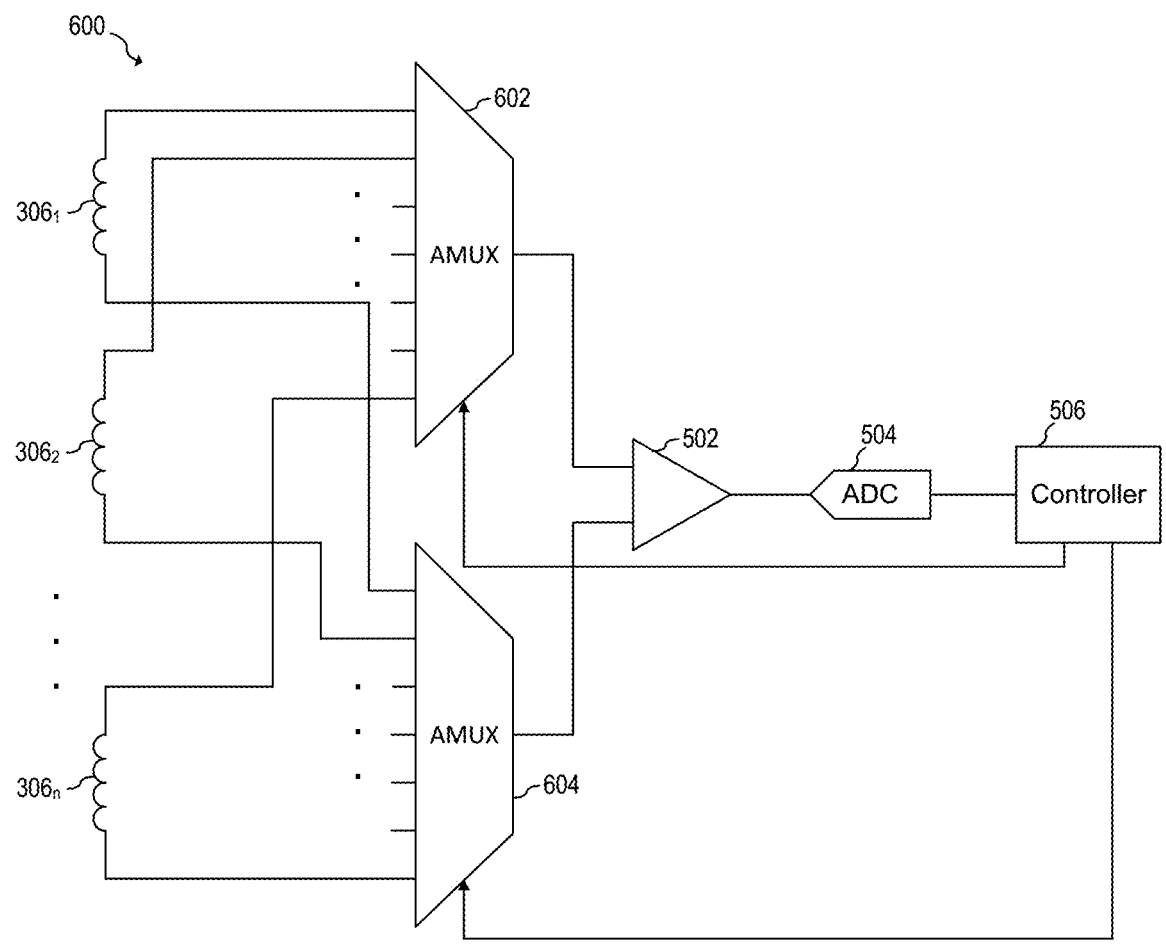
FIG. 6 shows a schematic diagram of a foreign object detection system, according to another embodiment of the present invention.

In some embodiments, an amplifier 502 and ADC 504 are used for each of the coils of the sensing array 110. In some embodiments, one or more ADC 504 and/or one or more amplifiers 504 may be used for a plurality of coils, by, for example, using one or more analog multiplexer. For example, FIG. 6 shows a schematic diagram of foreign object detection system 600, according to an embodiment of the present invention. Foreign object detection system 600 operates in a similar manner as foreign object detection system 500. Foreign object detection system 600, however, includes analog multiplexers (AMUXs) 602 and 604 to share amplifier 502 and ADC 504 with n coils of sensors 112, where n may be a subset of the total number of coils in sensing array 110 or all the coils in sensing array 110.

Measuring the voltage across each of the coils by ADC 504 when shared may be performed in any way known in the art. For example, in some embodiments, such measurements may be performed in a round-robin configuration. Such sampling of all sensors 112 (e.g., 50 sensors 112, 100 sensors 112, or more) may be performed in a few milliseconds or less (e.g., 10 ms). In some embodiments, a subset of the coils may be sampled in each round. Other implementations are also possible.

A controller, such as controller 506, may use the voltage across sensors 112 to detect foreign metallic objects. For example, the presence of a metallic object in a magnetic field decreases the strength of the magnetic field flowing through the metallic object. The magnetic field around such metallic object increases around the metallic object. Sensing array 110 may detect, for example, that a first sensor 112 (or a group of clustered sensors 112) shows a low magnetic field (e.g., low voltage) versus the sensors 112 around such first sensor 112. Such signature is indicative that a metallic object is located on top of the first sensor 112.

Controller 506 may be implemented in any way known in the art. For example, some embodiments may implement controller 506 with a general purpose controller. Other embodiments may implement controller 506 using a digital signal processor (DSP) or a field programmable gate array (FPGA). Yet other embodiments may implement controller 506 using custom logic, such as an application-specific integrated circuit (ASIC). Other implementations are also possible.

Figure 7A:
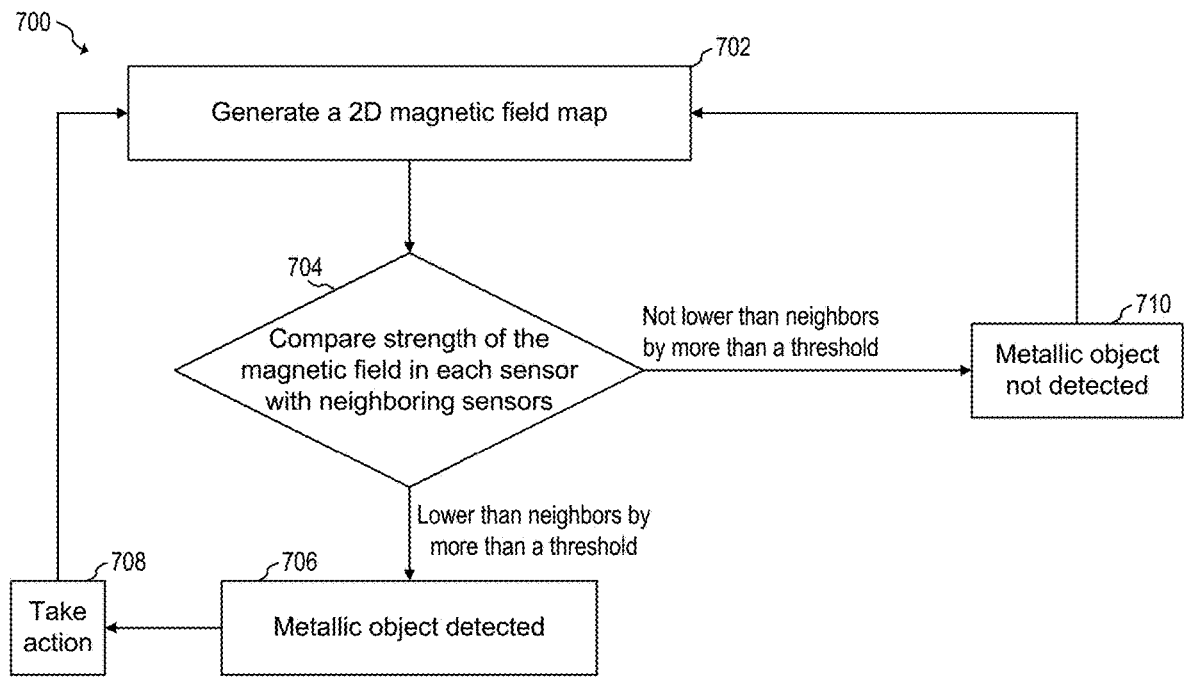
FIGS. 7A and 7B show flow charts of embodiment methods for detecting the presence of metallic objects near a charging surface of the power transmitter of FIG. 1, according to embodiments of the present invention.

FIG. 7A shows a flow chart of embodiment method 700 for detecting the presence of metallic objects near charging surface 114, according to an embodiment of the present invention. During step 702, sensing array 110 generates a 2D magnetic field map of the strength of the magnetic fields near charging surface 114.

During step 704, the magnetic field detected by each sensor 112 is compared with the magnetic fields detected by neighboring sensors 112. If the strength of the magnetic field of a first sensor 112 (or cluster of sensors 112) is lower than the surrounding magnetic fields by at least a first threshold, a metallic object is detect near the first sensor 112, as shown by step 706. If not, a metallic object is not detected, as shown in step 710.

If a metallic object is detected, an action, such as informing a user visually or audibly, stopping power transfer or reducing the amount of power transfer may be taken, as shown in step 708. In some embodiments, step 708 may involve taking no action.

As shown in FIG. 7A, monitoring may continue after steps 710 and 708. For example, in some embodiments, method 700 may be repeated every 100 ms. Other refreshed periods, such as every 200 ms or slower, or every 90 ms or faster may be used. In some embodiments, the refresh period may be constant. In other embodiments, the refresh period may vary.

The 2D magnetic field map may be affected by factors other than the presence of metallic objects. For example, the presence of power receiver 104 may cause an increase in the strength of the magnetic field near receiving antenna 116 due to the presence of a ferrite material. Such interactions between the presence of power receiver 104 and the presence of metallic objects near charging surface 114 may be considered when determining if a metallic object is present near charging surface 114. For example, such interactions may be characterized during a characterization or production phase to model such interactions. Such model may be used when determining if a metallic object is near charging surface 114.

In some embodiments, a method for detecting foreign objects may use the 2D magnetic field map in conjunction with additional information to determine the presence of metallic objects near charging surface 114. For example, in some embodiments, an array of temperature sensors disposed at or near charging surface 114 may be used to detect hot spots. Identifying such hot spots is advantageous because it improves the accuracy of detecting metallic objects near charging surface 114.

In some embodiments, correlations between disruptions in the magnetic field and in a 2D temperature map are used to detect the presence of metallic objects near charging surface 114. For example, a metallic object may create a mild disruption in the magnetic field (e.g., because it is small). By itself, such disruption may not be enough to conclude that a metallic object is present near charging surface 114. However, if the same location is also experiencing high temperatures, a metallic object is likely present where the magnetic field is being disrupted.

Some embodiments detect the magnetic field with sensors 112 by measuring the voltage across terminals of the respective coils (such as described with respect to FIGS. 5 and 6). Other embodiments may determine the strength of the magnetic field by detecting changes in the characteristics of the coil, such as the inductance or impedance of the coil, for example. Some embodiments may detect the strength of the magnetic field by first exciting the coils of sensing array 110 to build up a certain amount of energy in the coil, and then shorting the coil and measuring one or more of the parameters, such as peak amplitude, frequency of oscillation (e.g., resonant frequency), quality factor, damping factor, series resistance, etc. In some embodiment, the coils of sensing array 110 are energized with a pulse. Other embodiments energize the coils of sensing array 110 with a periodic signal. Other methods for energizing the coils of sensing array 110 may be used.

Advantages of some embodiments include the detection of the presence and location of metallic objects near the charging surface of a power transmitter by using a sensing array that includes a plurality of coils. Using a sensing array that includes a plurality of coils between the transmitting antenna(s) and the charging surface has the additional advantage of blocking the electric field, resulting in better electromagnetic interference (EMI) performance.

Detecting metallic objects in the electromagnetic field generated by a power transmitter may be achieved in other ways. For example, a conventional wireless charging system may detect whether a metallic object is in the electromagnetic field generated by the power transmitter by estimating the transmitted power by the power transmitter, estimating the received power by a power receiver, computing the lost power by subtracting the estimated received power from the transmitting power, and comparing the lost power to a threshold. If the lost power is higher than a threshold, a metallic object is likely present in the electromagnetic field generated by the power transmitter.

Figure 7B:
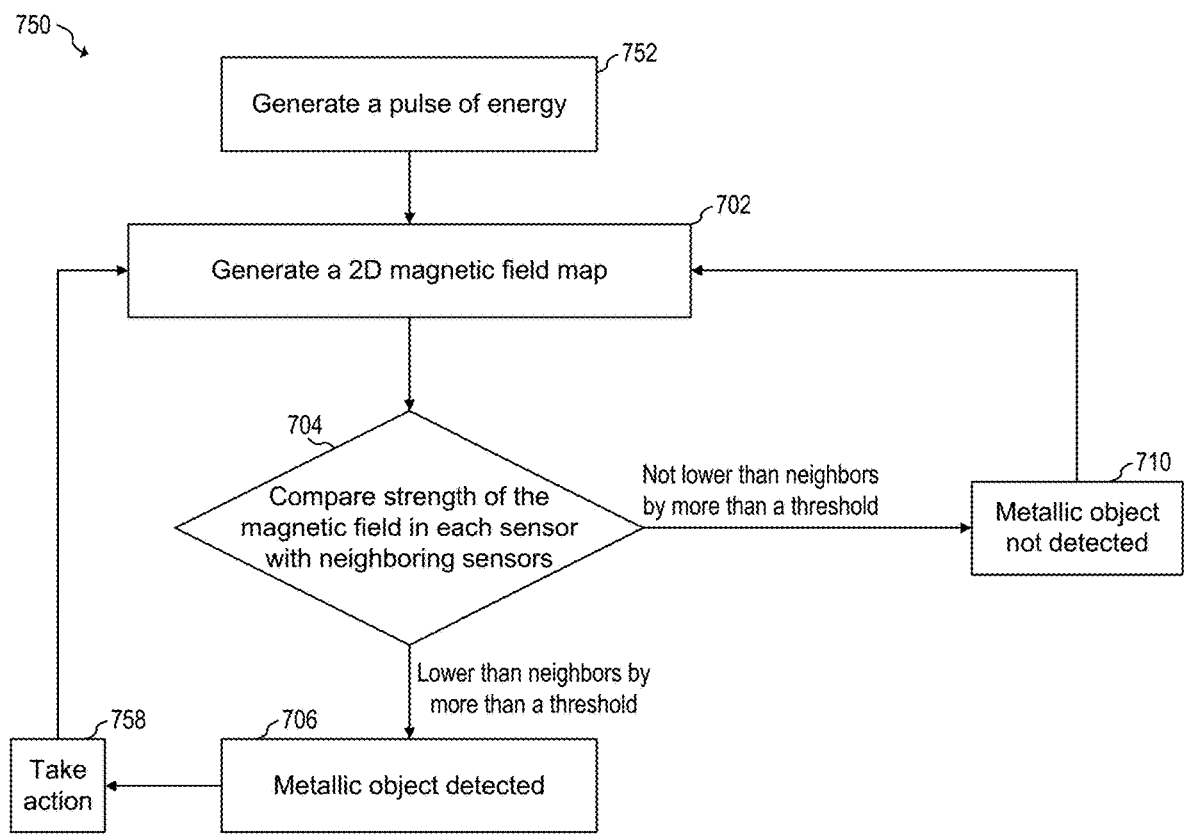

In some embodiments, it may be desirable to detect metallic objects before starting to transmit power from power transmitter 102. FIG. 7B shows a flow chart of embodiment method 750 for detecting the presence of metallic objects near charging surface 114 before starting to transmit power from power transmitter 102, according to an embodiment of the present invention. Method 750 is similar to method 700. During method 750, however, power transmitter 102 is not actively transmitting power. To generate a magnetic field that can be captured during step 702, power transmitter 102 generates a pulse of electromagnetic energy (e.g., during 1 ms). After the pulse, step 702 may be executed in a similar manner as described in method 700.

In some embodiments, the coils in sensors 112 may be pulsed instead of power transmitter 102 generating the pulse of electromagnetic energy during step 752.

If a metallic object is detected during method 750, actions such as not starting to charge until the metallic object is removed, and notifying a user that a metallic object is present may be performed during step 758.

Controller 506 may use sensing array 110 to detect the location of power receiver 104. Such location may be used by power transmitter 102 to activate or use transmitting antenna 108 that is better located (e.g., nearest) for transmitting power to power transmitter 108. For example, the presence of power receiver 104 may cause an increase in the strength of the magnetic field near receiving antenna 116 due to the presence of a ferrite material. The 2D magnetic field map, therefore, may be processed to identify the location of power receiver 104 by analyzing the changes in the strength and direction of the magnetic field based on the 2D magnetic field map.

Power transmitter 102 may also use the location of power receiver 104 to provide feedback, such as audio, visual, and haptic feedback to a user to aid with the positioning of power receiver 104 in charging surface 114.

Determining the location of power receiver 104 is advantageous for various reasons. For example, the location of power receiver 104 may aid in increasing the accuracy of detecting metallic objects in the electromagnetic field generated by power transmitter 102 since the presence of power receiver 104 at a particular location may help explain some of the disruptions in the 2D magnetic field map.

Additional advantages include the amount of power transmitted by a particular transmitting antenna 108 may be increased or decreased based on knowledge of the location of power receiver 104. For example, if power receiver 104 is near a first transmitting antenna (e.g., $108_2$) and far from a second transmitting antenna (e.g., $108_3$), controller 506 may increase the power transmitted by the first transmitting antenna (e.g., $108_2$) and decrease the power transmitted by the second transmitting antenna (e.g., $108_3$). In some embodiments, controller 506 may switch the active antenna from the second transmitting antenna (e.g., $108_3$) to the first transmitting antenna (e.g., $108_2$).

Figure 8:
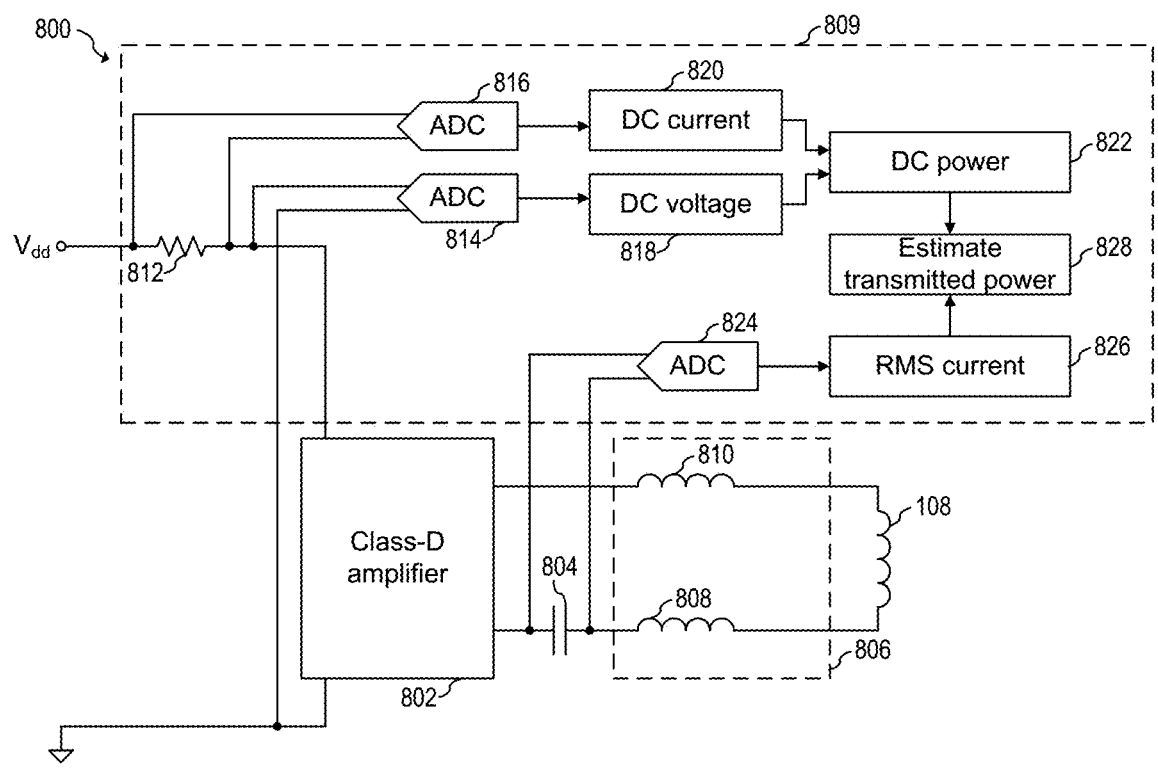
FIG. 8 shows a power transmitter circuit having a conventional foreign object detection circuit used to estimate the transmitted power.

FIG. 8 shows power transmitter circuit 800 having conventional foreign object detection circuit 809 used to estimate the transmitted power. Power transmitter circuit 800 includes class-D amplifier 802, EMI filter 806, and resonant capacitor 804 for driving transmitting antenna 108. Foreign object detection circuit 809 includes sense resistor 812, and ADCs 814, 816, and 824.

During normal operation, class-D amplifier 802 drives antenna 108 with an alternating current (AC) to generate an electromagnetic field for transmitting power. Foreign object detection circuit 809 estimates the transmitted power by measuring the input DC current during step 820, measuring the input DC voltage during step 818 and calculating the input DC power during step 822. The RMS current flowing through transmitting antenna 108 is estimated in step 826 by measuring peak voltages with a peak detector using ADC 824. The estimated transmitted power is computed by subtracting from the input DC power the estimated losses in class-D amplifier 802, filter 806 and transmitting antenna 108 based on the measured RMS current.

EMI filter 806 is used to reduce EMI generated by class-D amplifier 802. For example, inductors (or ferrite beads—also known as ferrite chokes) 808 and 810 attenuate high-order harmonics generated by the outputs of class-D amplifier 802.

Estimating losses in power transmitter circuit 800 to estimate the transmitted power may be affected by the use of EMI filtering components, such as filter 806, and the dynamic variations of the characteristics of circuits such as class-D amplifier 802. For example, the conduction and switching losses in class-D amplifier 802 (e.g., in the bridge FETs) may not be easily predictable and the losses in the EMI filtering components depend on the harmonic content of the current flowing through transmitting antenna 108 and the voltage waveforms generated by class-D amplifier 802. Temperature variations also affect the accuracy of the estimates of losses in power transmitter circuit 800.

In some embodiments, better EMI performance is achieved while achieving higher accuracy in estimating the transmitted power when compared to conventional systems and methods by using a class-E amplifier and by measuring the instantaneous current flowing through the transmitting antenna and the voltage across the transmitting antenna. In some embodiments, the instantaneous AC current flowing through the transmitting antenna is measured by measuring the voltage across thermally stable components, such as the resonant capacitor. In some embodiments, a class-D amplifier, for example, may be used instead of a class-E amplifier.

Figure 9:
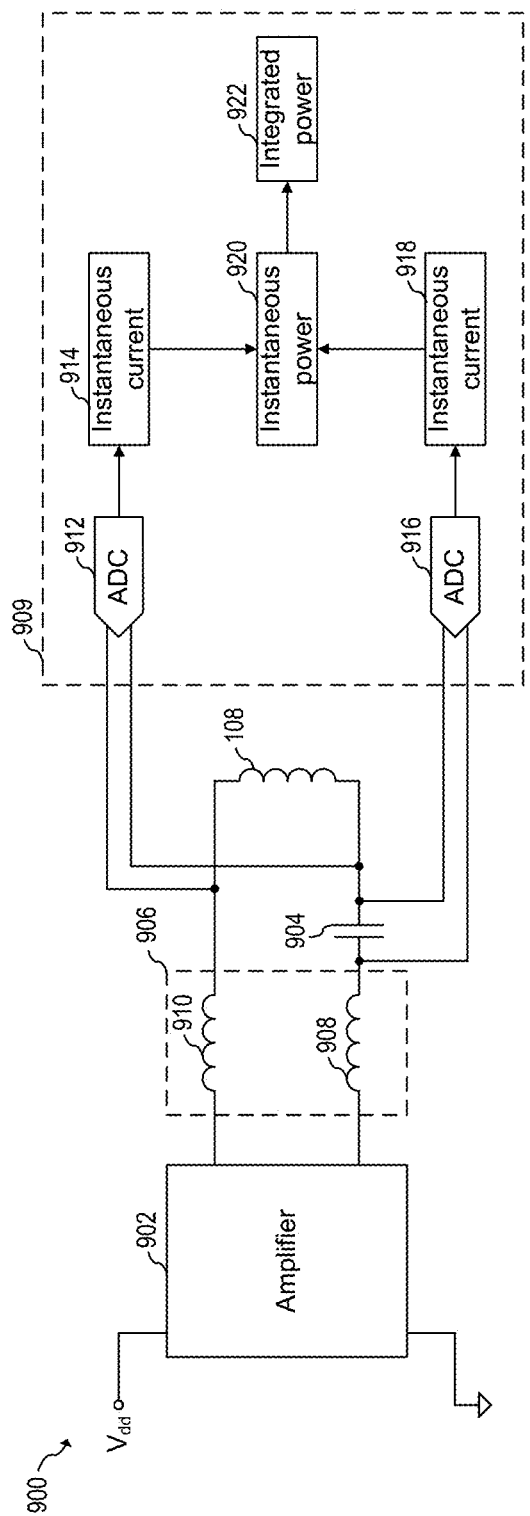
FIG. 9 shows a power transmitter circuit having a foreign object detection circuit, according to an embodiment of the present invention.

FIG. 9 shows power transmitter circuit 900 having foreign object detection circuit 909, according to an embodiment of the present invention. Power transmitter circuit 900 includes amplifier 902, EMI filter 906, and resonant capacitor 904 for driving transmitting antenna 108. Foreign object detection circuit 909 includes ADCs 912 and 916.

During normal operation, amplifier 902 drives antenna 108 with an AC current to generate an electromagnetic field for transmitting power. Class-E amplifiers advantageously generate less EMI than a comparable class-D amplifier.

EMI filter 906 includes inductors (or ferrite beads) 908 and 910. Since class-E amplifiers generate less EMI radiation than a comparable class-D amplifier, it is possible to implement EMI filter 906 without a parallel capacitance.

In some embodiments, power transmitter circuit 900 is implemented without EMI filter 906.

Foreign object detection circuit 909 estimates the power transmitted by measuring the instantaneous current flowing through transmitting antenna 108 during step 918 using ADC 916; measuring the instantaneous voltage across transmitting antenna 108 during step 914 using ADC 912; and computing the instantaneous power transmitted by the antenna 108 in step 920 based on the measured instantaneous current and voltage. The instantaneous power computed in step 920 is integrated over time to determine an average transferred power during step 922. Since the instantaneous current and the instantaneous voltage is measured directly at the transmitting antenna, it is possible to accurately determine the instantaneous transmitted power and the average transmitted power without estimating losses in amplifier 902 and EMI filter 906.

In some embodiments, the instantaneous current, the instantaneous voltage, and the instantaneous power is measured during each AC cycle period of the AC current flowing through transmitting antenna 108.

Steps 914, 918, 920 and 922 may be implemented, for example, by a controller, such as controller 506. In some embodiments, other implementations such as using analog circuits or mixed signal circuits may be used.

ADCs 912 and 916 may be implemented in any way known in the art. For example, in some embodiments, ADCs 912 and 916 may be implemented as SAR ADCs, sigma-delta ADCs. In some embodiments, a single ADC is shared to measuring the voltage across resonant capacitor 904 and across transmitting antenna 108 by, e.g., using an analog multiplexer.

Additional circuits (not shown) may be used to implement the voltage and current measurements. For example, some embodiments may include a differential amplifier coupled between resonant capacitor 904 and ADC 916. Similarly, a differential amplifier may be coupled between transmitting antenna 108 and AC 912.

Advantages of some embodiments include the accurate estimation of transferred power without having to measure input DC power and without having to rely and on estimates for the losses of various blocks, such as the losses in the amplifier stage and EMI filter. In addition to avoiding the associated computational complexity, by measuring the instantaneous current flowing through the transmitting antenna and the voltage across the transmitting antenna, higher accuracy of the transmitted power is achieved. For example, estimation errors for the non-linear losses in the amplifier, including losses in the bridge of the amplifier, and EMI filters are avoided.

Some embodiments combine the circuits and methods described in FIGS. 8 and 9 with the embodiments described in FIGS. 1-7. For example, correlation between the presence of metal objects in the electromagnetic fields detected by sensing array 110 and foreign object detection circuit 909 may be used to increase the confidence that a metallic object is present.

As shown in FIG. 9, amplifier 902 is differential. In some embodiments, amplifier 902 may be implemented in a single-ended manner.

Amplifier 902, also referred to as diver 902, may be implemented, for example, as a class-E amplifier or as a class-D amplifier. Other types of amplifiers, such as class-AB amplifiers, may be used.

Figure 10:
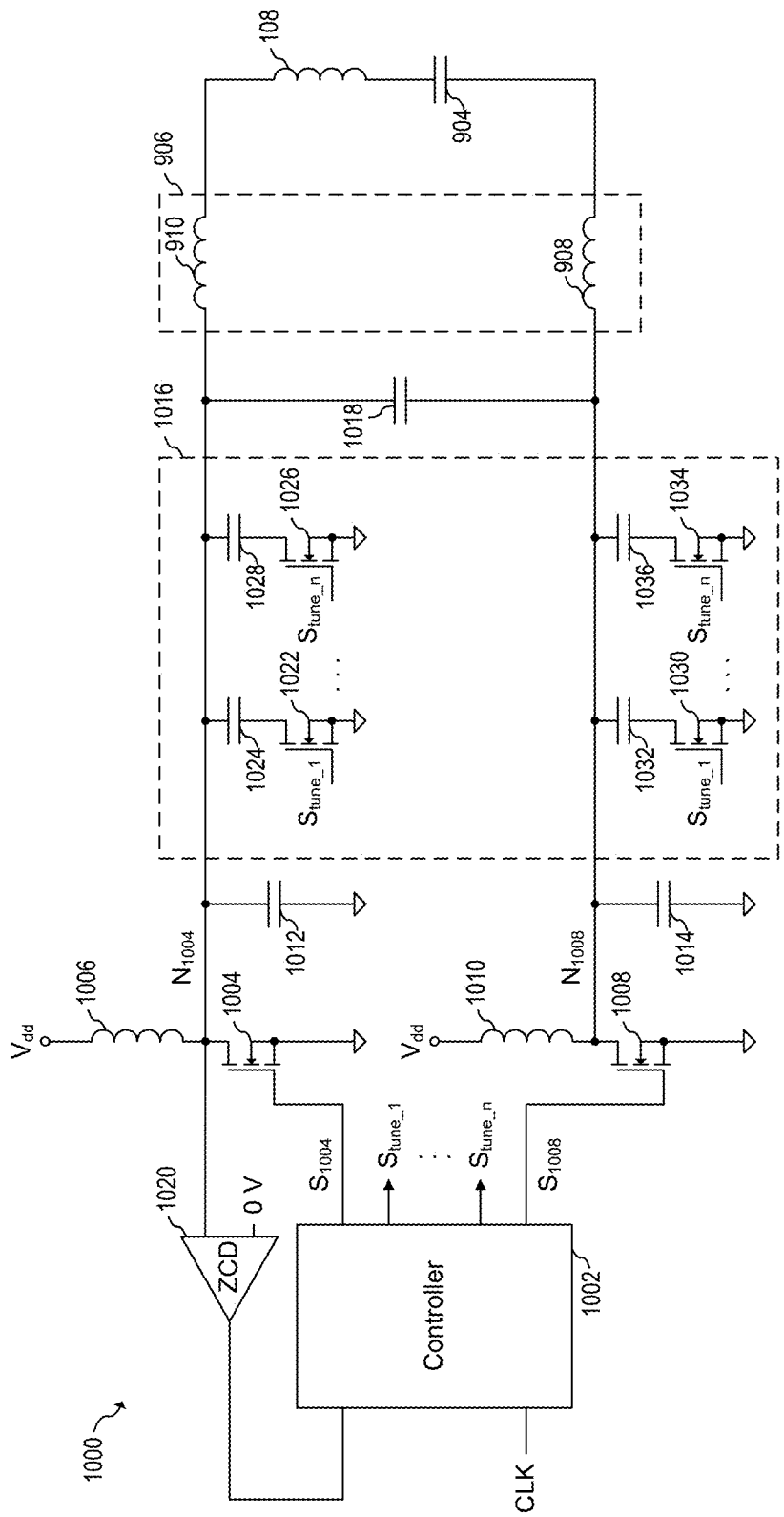
FIG. 10 shows a schematic diagram of a class-E amplifier, according to an embodiment of the present invention.
Figure 11:
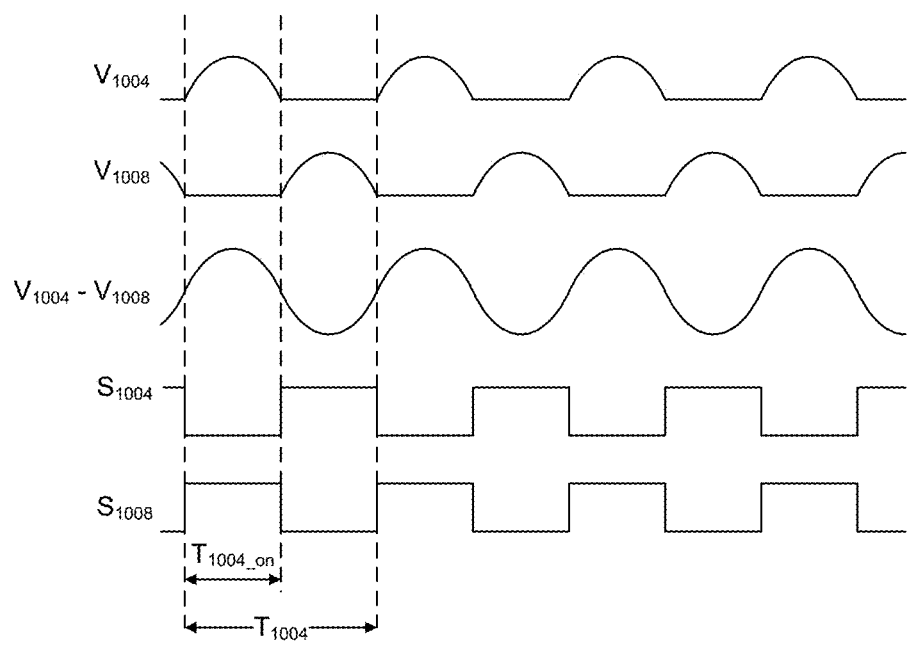
FIGS. 11 and 12 show waveforms of the class-E amplifier of FIG. 10, according to embodiments of the present invention.

Amplifier 902 may be implemented in various ways. For example, FIG. 10 shows a schematic diagram of class-E amplifier 1000, which is a possible implementation of amplifier 902, according to an embodiment of the present invention. FIG. 11 shows waveforms of class-E amplifier 1000, according to embodiments of the present invention. Class-E amplifier 1000 includes controller 1002, transistors 1004 and 1008, inductors 1006 and 1010, tuning bank 1016, shunt capacitor 1018 and zero-crossing detection circuit 1020.

During normal operation, controller 1002 switches transistors 1004 and 1008 at a low frequency (e.g., between 80 kHz and 400 kHz) to generate an AC current flowing through transmitting antenna 108. For example, as shown in FIG. 11, transistor 1004 is turned on when voltage $V_{1004}$ is near 0 V and is turned off when transistor 1008 is turned on. Similarly, transistor 1008 is turned on when voltage $V_{1008}$ is near 0V and is turned off when transistor 1004 is turned on.

Voltage waveforms $V_{1004}$ and $V_{1008}$ at nodes $N_{1004}$ and $N_{1008}$, respectively, approximate half of a sine wave, as shown in FIG. 11. Voltage waveforms $V_{1004}$ and $V_{1008}$ has lower harmonic content than the square waves generated by class-D amplifiers, such as class-D amplifier 802. Since the harmonic content of the coil driving signal is much lower for class-E drivers compared to class-D drivers, the losses in the transmitter transmitting antenna and in any filtering components are lower and more predictable across the full spectrum of loads and coupling factors between the power transmitter and the receiving antenna of the power receiver.

In some embodiments, the switching frequency corresponds to the resonant frequency of class-E amplifier 1000, which is affected by the inductance of inductors 1006 and 1010, capacitors 1012 and 1014, the load coupled to class-E amplifier 1000 (e.g., EMI filter 906, antenna 108 and resonant capacitor 904), and other factors such as the magnitude of current flowing through the load, the temperature of the components, etc.

Turning on transistors 1004 and 1008 using ZVS or QZVS may result in improved efficiency. ZVS or QZVS occurs when the body diode of transistors 1004 and 1008 starts conducting. When the body diode of transistors 1004 (or transistor 1008) starts conducting, voltage $V_{1004}$ (or voltage $V_{1008}$) drops below 0 V (not shown in FIG. 11). Zero-crossing detector ZCD circuit 1020 is used to the zero-crossing (from above 0V to below 0V).

As shown in FIG. 11, voltages $V_{1004}$ and $V_{1008}$ are 180° out of phase. Controller 1002 turns on transistor 1008 when ZCD circuit 1020 detects a zero crossing. Controller 1002 turns on transistor 1004 based on the known period of $V_{1004}$ and $V_{1008}$.

In some embodiments, an adaptive mechanism may be used to turn on transistors 1004 and 1008. For example, in some embodiments, a second ZVD circuit (not shown) coupled to node $N_{1008}$ is used to determine when to turn on transistor 1004.

ZCD circuit 1020 may be implemented in any way known in the art. For example, some embodiments, may implement ZCD circuit 1020 with a comparator in series with a one shot circuit. Other analog implementations are also possible.

In some embodiments, controller 1020 may implement zero-crossing detection digitally by sampling voltage $V_{1004}$ and/or voltage $V_{1008}$ using an ADC, for example. The ADC may sample voltages $V_{1004}$ and/or $V_{1008}$ at a high sampling rate and/or sampling voltages $V_{1004}$ and/or $V_{1008}$ using different phase delays across multiple periods of voltages $V_{1004}$ and/or $V_{1008}$.

As shown, ZCD circuit 1020 uses 0 V as the zero-crossing threshold (or a value near 0 V, such as −0.35 V).

In some embodiments, controller 1020 may be implemented as a part of controller 506. In other embodiments, controller 1020 may be implemented independently from controller 506.

The switching duty cycle of class-E amplifier 1000 (e.g., the ratio between time $T_{1004\_on}$ over period $T_{1004}$) is determined by the class-E amplifier 1000 elements (e.g., inductances, capacitances, etc., of power transmitter 102) and the load (e.g., transmitting antenna 108), which is affected by power receiver 104.

In some embodiments, the switching duty cycle is substantially equal to 50%. Operating class-E amplifier 1000 with a 50% duty cycle may result in higher efficiency and higher power transfer.

Figure 12:
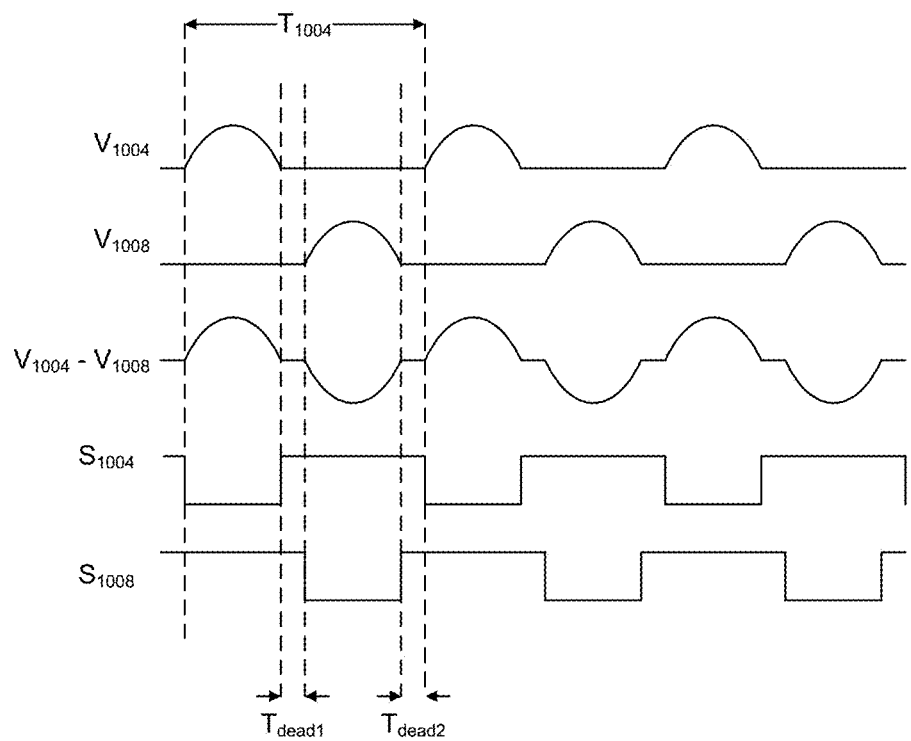

In some embodiments, class-E amplifier 1000 operates at a fixed frequency (e.g., a frequency between 100 kHz and 150 kHz) based, for example, in clock CLK. In such embodiments, better efficiency may be achieved by operating class-E amplifier 1000 in ZVS or QZVS. For example, FIG. 12 shows waveforms of class-E amplifier 1000 operating at a fixed frequency, according to an embodiment of the present invention. As shown in FIG. 12, voltages $V_{1004}$ and $V_{1008}$ are 180° out of phase. Controller 1002 turns on transistor 1008 when ZCD circuit 1020 detects a zero crossing. Controller 1002 turns on transistor 1004 based on a fixed frequency (i.e., $1/T_{1004}$ equals a fixed frequency), such as, for example, at a rising edge and/or falling edge of clock CLK. To achieve better efficiency, both transistors $T_{1004}$ and $T_{1008}$ turn on during dead times $T_{dead1}$ and $T_{dead2}$.

The resonant frequency of class-E amplifier 1000 may affect the power transfer and efficiency of power transmitter 102 when operating at a fixed frequency. For example, when the resonant frequency of class-E amplifier 1000 is higher than the fixed frequency, dead times $T_{dead1}$ and $T_{dead2}$ may be large, thereby decreasing the amount of power that can be transferred. When the resonant frequency of class-E amplifier 1000 is lower than the fixed frequency, ZVS or QZVS switching may not be possible (as the fixed frequency forces transistor 1004 to be turned on before reaching 0V). When the resonant frequency of class-E amplifier 1000 is equal than the fixed frequency, dead times $T_{dead1}$ and $T_{dead2}$ are zero.

Controller 1002 may use tuning bank 1016 to adjust the resonance frequency of class-E amplifier 1000 to keep dead times $T_{dead1}$ and $T_{dead2}$ within a target operating range (e.g., in some embodiments, dead times $T_{dead1}$ and $T_{dead2}$ are between 50 ns and 250 ns). For example, if dead times $T_{dead1}$ and $T_{dead2}$ are higher than expected (i.e., higher resonant frequency), controller 1002 may connect capacitors between node $N_{1004}$ and ground and between node $N_{1008}$ and ground by turning on one or more transistors of tuning bank 1016 until dead times $T_{dead1}$ and $T_{dead2}$ are within the expected range. Similarly, controller 1002 may disconnect capacitors between node $N_{1004}$ and ground and between node $N_{1008}$ and ground by turning off one or more transistors of tuning bank 1016 until dead times $T_{dead1}$ and $T_{dead2}$ are within the expected range.

Dynamic tuning using tuning bank 1016 may also help achieve a switching duty cycle substantially equal to 50%. The capacitance at nodes $N_{1004}$ and $N_{1008}$ is increased if the duty cycle is too low. The capacitance is decreased at nodes $N_{1004}$ and $N_{1008}$ if the duty cycle is too high.

In some embodiments, controller 1002 connects and/or disconnects capacitors of tuning bank 1016 during dead times $T_{dead1}$ and/or $T_{dead2}$.

Tuning bank 1016 has n capacitors connected between node $N_{1004}$ and ground via respective transistors, and n capacitors connected between node $N_{1008}$ and ground via respective transistors. In some embodiments, n may be a number between 1 and 16. A different number may be used.

In some embodiments, the capacitors of tuning bank 1016 may be equal capacitance. In other embodiments, different capacitances may be used (e.g., capacitors 1024 and 1032 having capacitance C, and capacitors 1028 and 1036 having capacitance $2^n*C$). By using different capacitance for the capacitors of tuning bank 1016, a wider range of fixed frequencies may be supported by class-E amplifier 1000.

In some embodiments, controller 1002 may connect or disconnect capacitors of tuning bank using shared control signals (e.g., $S_{tune\_n}$). In other embodiments, each of the transistors of tuning bank 1016 is controlled independently.

In some embodiments, tuning bank 1016 is used to vary the resonance frequency of class-E amplifier 1000 when operating at resonance, such as shown in FIG. 11.

Transistors 1004 and 1008 are n-type metal oxide field effect transistors (MOSFETs). P-type transistors may also be used. In some embodiments, transistors 1004 and 1008 may be implemented using other types of transistors, such as MOSFETs, gallium nitride (GaN) transistors, and insulated gate bipolar transistors (IGBTs). Other implementations may also be used.

Transistors 1024, 1028, 1032, and 1036 (and other transistors coupling the plurality of capacitors of tuning bank 1016 to ground) are n-type MOSFETs. Other types of transistors or other circuits that may function as switches may be used.

Inductors 1006 and 1010 may be implemented, for example as an air core inductor or a ferrite core inductor. Other types of inductors may also be used.

As shown in FIGS. 11 and 12, antenna 108 is exposed to two waveforms ($V_{1004}$ and $V_{1008}$) that are each approximately equal to a half-sinewave waveform. Even though for purposes of wireless power transmission, transmitting antenna 108 transmits a signal based on the difference of $V_{1004}$-$V_{1008}$ (see FIGS. 11 and 12), for EMI purposes, signals $V_{1004}$ and $V_{1008}$ look like a half-sinewave superimposed with a square wave.

Figure 13:
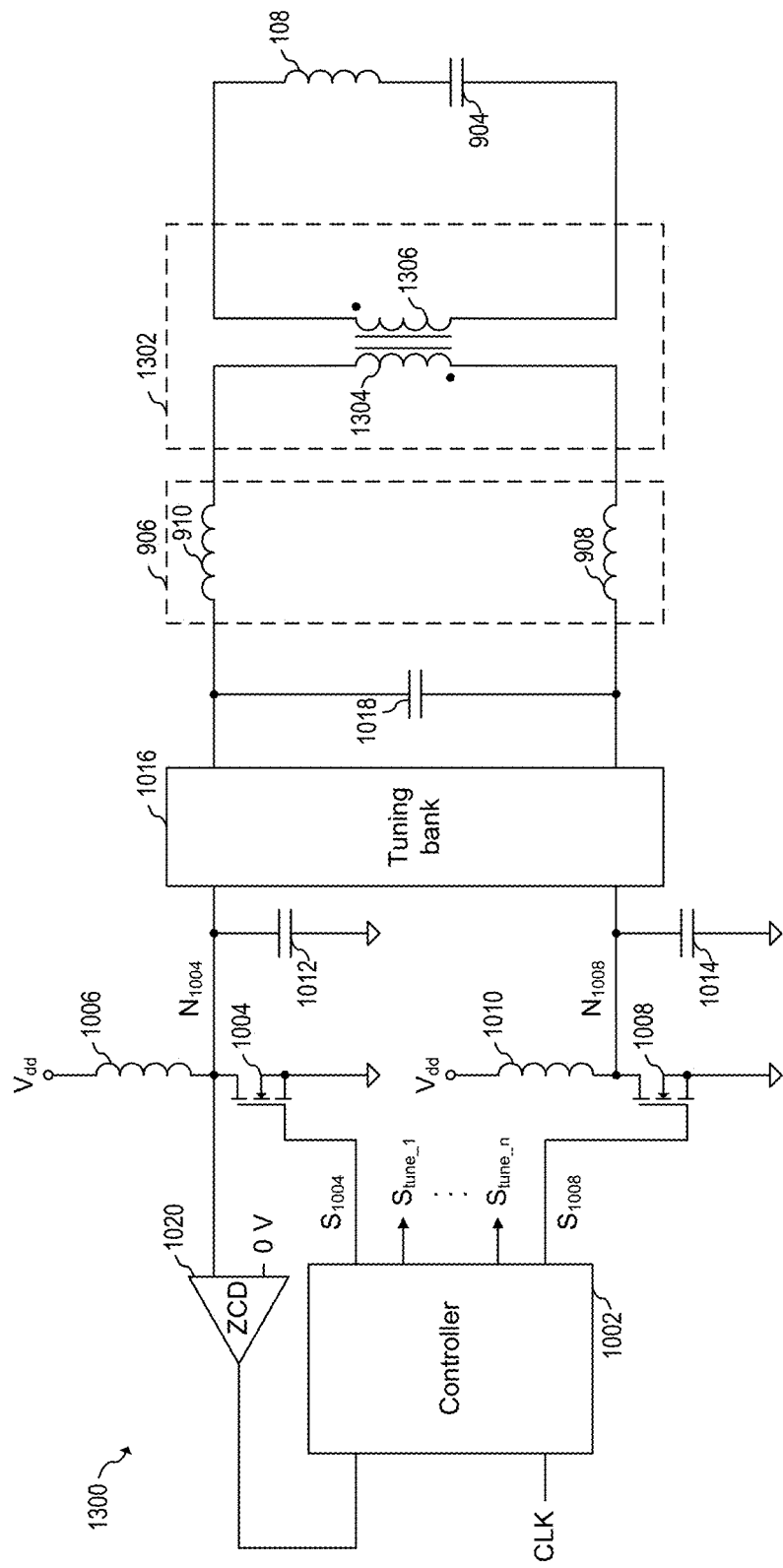
FIG. 13 shows a schematic diagram of a class-E amplifier that uses a transformer, according to an embodiment of the present invention.

Some embodiments improve EMI performance by exposing transmitting antenna 108 to a signal that is approximately equal to a sinewave for EMI purposes by using a transformer. For example, FIG. 13 shows a schematic diagram of class-E amplifier 1300, according to an embodiment of the present invention. Class-E amplifier 1300 operates in a similar manner than class-E amplifier 1000. Class-E amplifier 1300, however, uses transformer 1302 between switching transistors 1004 and 1008, and transmitting antenna 108 to achieve better EMI.

Transformer 1302 receives signals $V_{1004}$ and $V_{1008}$ across primary winding 1304, e.g., as shown in FIGS. 11 and 12. Transformer 1302 produces across secondary windings 1306 a signal $V_{1004}$-$V_{1008}$ (e.g., as shown in FIGS. 11 and 12), which is delivered to transmitting antenna 108.

Advantages of some embodiments include better EMI performance by exposing transmitting antenna 108 to a signal that is approximately equal to a sinewave.

In some embodiments, transformer 1302 is implemented having good coupling factor (e.g., 0.99 or better), where possible coupling factors range between 0 and 1.

Other embodiments may implement transformer with coupling less than 0.99, such as 0.8 or lower, such as 0.5. By having less than a good coupling factor (e.g., between 0.5 and 0.8), changes in the impedance of transmitting antenna 108 (e.g., due to power receiver 104 moving) are decoupled from nodes $N_{1004}$ and $N_{1008}$. Therefore, changes in the impedance of transmitting antenna 108 do not affect, or affect less the resonant frequency of class-E amplifier 1300.

In some embodiments, class-E amplifier 1300 may be implemented without tuning bank 1016 and/or without EMI filter 906.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A wireless power transmitter comprising:
a transmitting antenna;
a resonant capacitor coupled in series with the transmitting antenna;
a class-E amplifier comprising:
a switching transistor coupled between an intermediate node and a reference terminal, the intermediate node coupled to the transmitting antenna,
an inductor coupled between a supply terminal and the intermediate node; and
a controller coupled to the switching transistor, the controller configured to turn on and off the switching transistor at a switching frequency between 80 kHz and 400 kHz.

2. The wireless power transmitter of claim 1, wherein the class-E amplifier further comprises a capacitor tuning bank coupled to the intermediate node, and wherein the controller is further configured to:

when the switching frequency is higher than a target frequency, increase a capacitance connected to the intermediate node by controlling the capacitor tuning bank; and
when the switching frequency is lower than the target frequency, decrease the capacitance connected to the intermediate node by controlling the capacitor tuning bank.

3. The wireless power transmitter of claim 2, wherein the class-E amplifier further comprises:
a second switching transistor coupled between a second intermediate node and the reference terminal, the second intermediate node coupled to the transmitting antenna; and
a second inductor coupled between the supply terminal and the second intermediate node, wherein the capacitor tuning bank is further coupled to the second intermediate node, and
wherein the controller is further configured to turn on and off the second switching transistor.

4. The wireless power transmitter of claim 3, wherein the controller is configured to turn on and off the switching transistor and the second switching transistor out of phase at a fixed frequency.

5. The wireless power transmitter of claim 3, wherein the controller is configured to turn on and off the switching transistor and the second switching transistor 180° out of phase.

6. The wireless power transmitter of claim 3, wherein the controller is configured to:
turn on the switching transistor when the second switching transistor is on;
turn off the second switching transistor a first time after turning on the switching transistor;
turn on the second switching transistor after turning off the second switching transistor; and
turn off the switching transistor a second time after turning on the second switching transistor.

7. The wireless power transmitter of claim 6, wherein the controller is further configured to determine when the switching frequency is higher or lower than the target frequency based on the first time or the second time.

8. The wireless power transmitter of claim 3, further comprising a transformer having a primary winding coupled between the intermediate node and the second intermediate node, and a secondary winding coupled to the transmitting antenna.

9. The wireless power transmitter of claim 1, wherein the class-E amplifier further comprises a zero-crossing detector circuit coupled between the intermediate node and the controller, and wherein the controller is configured to determine when to turn on the switching transistor based on an output of the zero-crossing detector circuit.

10. The wireless power transmitter of claim 1, wherein the class-E amplifier further comprises an electromagnetic interference (EMI) filter coupled between the intermediate node and the transmitting antenna.

11. A wireless power transmitter comprising:
a transmitting antenna;
a resonant capacitor coupled in series with the transmitting antenna;
a class-E amplifier comprising:
a first switching transistor coupled between a first intermediate node and a reference terminal, the first intermediate node coupled to the transmitting antenna, a second switching transistor coupled between a second intermediate node and the reference terminal, the second intermediate node coupled to the transmitting antenna, a first inductor coupled between a supply terminal and the first intermediate node, a second inductor coupled between the supply terminal and the second intermediate node, a transformer having a primary winding coupled between the first intermediate node and the second intermediate node, and a secondary winding coupled to the transmitting antenna; and a controller coupled to the first and second switching transistors, the controller configured to turn on and off the first and second switching transistors at a switching frequency.

12. The wireless power transmitter of claim 11, wherein the controller is configured to turn on and off the first and second switching transistors at a fixed frequency between 80 kHz and 200 kHz.

13. The wireless power transmitter of claim 11, wherein the controller is configured to:

turn on the first switching transistor when the second switching transistor is on;

turn off the second switching transistor a first time after turning on the first switching transistor;

turn on the second switching transistor after turning off the second switching transistor; and turn off the first switching transistor a second time after turning on the second switching transistor.

14. The wireless power transmitter of claim 13, wherein the class-E amplifier further comprises a zero-crossing detector circuit coupled to the first intermediate node, and wherein the controller is configured to determine the first time and the second time based on an output of the zero-crossing detector circuit.

15. The wireless power transmitter of claim 14, wherein the class-E amplifier further comprises a capacitor tuning bank coupled to the first and second intermediate nodes, and wherein the controller is configured to adjust a capacitance connected to the first intermediate node using the capacitor tuning bank based on the first time or second the second time.

16. The wireless power transmitter of claim 15, wherein the controller is configured to increase the capacitance connected to the first intermediate node using the capacitor tuning bank when the first time or the second time is higher than a first threshold.

17. The wireless power transmitter of claim 16, wherein the controller is configured to decrease the capacitance connected to the first intermediate node using the capacitor tuning bank when the first time or the second time is lower than a second threshold, wherein the first threshold is higher than the second threshold.

18. The wireless power transmitter of claim 17, wherein the first threshold is about 250 ns and the second threshold is about 50 ns.

* * * * *